(12) United States Patent
Filseth et al.

(10) Patent No.: US 7,149,340 B2
(45) Date of Patent: Dec. 12, 2006

(54) MASK DEFECT ANALYSIS FOR BOTH HORIZONTAL AND VERTICAL PROCESSING EFFECTS

(75) Inventors: Paul Filseth, Los Gatos, CA (US); Neal Callan, Lake Oswego, OR (US); Kunal Taravade, Portland, OR (US); Mario Garza, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 784 days.

(21) Appl. No.: 10/251,082

(22) Filed: Sep. 20, 2002

(65) Prior Publication Data

US 2004/0057610 A1    Mar. 25, 2004

(51) Int. Cl.
*G06K 9/00* (2006.01)
(52) U.S. Cl. ............... 382/144; 382/141; 382/149; 348/126
(58) Field of Classification Search ............ 382/141, 382/144, 149, 145; 348/87, 125; 702/35, 702/81; 430/5, 30; 716/19, 21
See application file for complete search history.

(56) References Cited

U.S. PATENT DOCUMENTS

| | | | |
|---|---|---|---|
| 4,926,489 A | 5/1990 | Danielson et al. | |
| 5,046,111 A | 9/1991 | Cox et al. | |
| 5,497,007 A | 3/1996 | Uritsky et al. | |
| 5,705,301 A | 1/1998 | Garza et al. | |
| 6,078,738 A | 6/2000 | Garza et al. | |
| 6,081,659 A | 6/2000 | Garza et al. | |
| 6,292,582 B1 * | 9/2001 | Lin et al. ............... | 382/149 |
| 6,658,640 B1 * | 12/2003 | Weed ............... | 716/19 |
| 6,757,645 B1 * | 6/2004 | Chang et al. ............ | 703/13 |
| 2002/0019729 A1 | 2/2002 | Chang et al. | |

OTHER PUBLICATIONS

A. Novicoff, "On Convergence Proofs for Perceptrons", "Symposium on Mathematical Theory of Automata",, Publisher: Polytechnic Institute of Brooklyn, Published in: U.S.
A. H. Land and A. G. Doig, "An Automatic Method of Solving Discrete Programming Problems", "Econometrica", Jul. 1960, pp. 497-520, vol. 28, No. 3, Published in: US.
F. Rosen Blatt, "The Perceptron: A Probabilistic Model For Information Storage and Organization in the Brain", "Psychological Review", 1958, pp. 386-408, vol. 65, No. 6, Published in: US.
John D.C. Little, et al., "An Algorithm for the Traveling Salesman Problem", Mar. 6, 1963, pp. 972-989, Published in: US.

* cited by examiner

*Primary Examiner*—Bhavesh M. Mehta
*Assistant Examiner*—John Strege
(74) *Attorney, Agent, or Firm*—Strategic Patent Group, Inc.

(57) ABSTRACT

A method and system for detecting defects in a physical mask used for fabricating a semiconductor device having multiple layers is disclosed, where each layer has a corresponding mask. The method and system include receiving a digital image of the mask, and automatically detecting edges of the mask in the image using pattern recognition. The detected edges, which are stored in a standard format, are imported along with processing parameters into a process simulator that generates an estimated aerial image of the silicon layout that would be produced by a scanner using the mask and the parameters. The estimated aerial image is then compared to an intended aerial image of the same layer, and any differences found that are greater than predefined tolerances are determined to horizontal defects. In addition, effects that the horizontal defects may have on adjacent layers are analyzed to discover vertical defects.

26 Claims, 4 Drawing Sheets

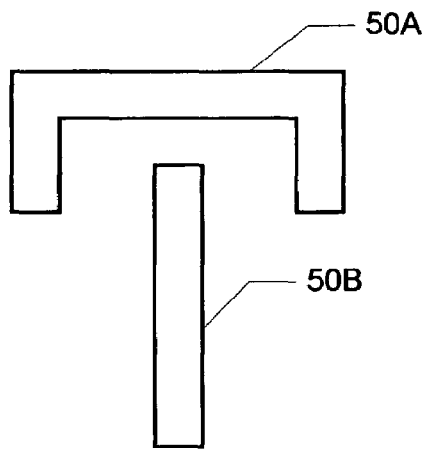
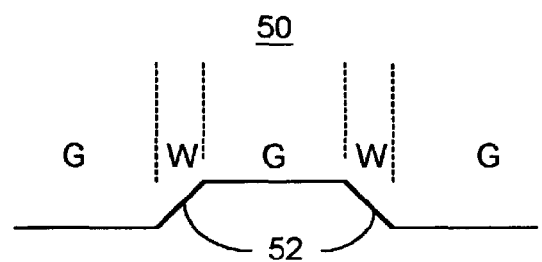
FIG. 2A  FIG. 2B
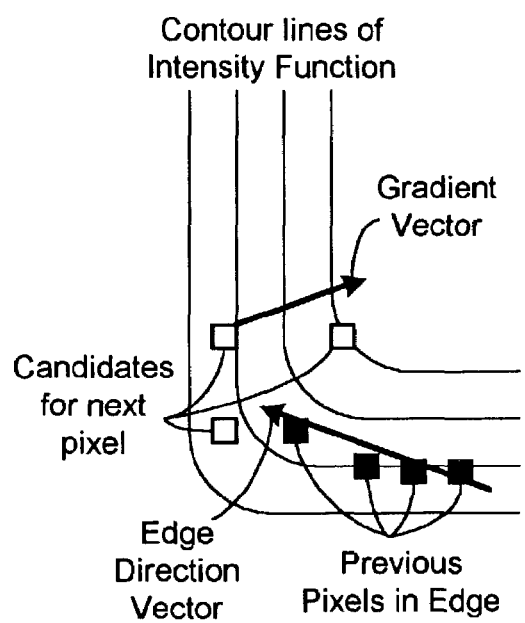
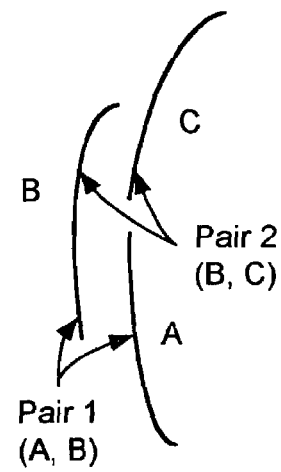
FIG. 4  FIG. 5

MASK DEFECT ANALYSIS FOR BOTH HORIZONTAL AND VERTICAL PROCESSING EFFECTS

FIELD OF THE INVENTION

The present invention relates to detecting mask defects in semiconductor masking photolithographic processes, and more particular to analyzing the effects of any detected defects via aerial/latent image simulations using a photograph of the mask as input.

BACKGROUND OF THE INVENTION

An integrated circuit is fabricated by translating a circuit design or layout to a semiconductor substrate. In optical lithography, the layout is first transferred onto a physical template, which is in turn, used to optically project the layout onto a silicon wafer. In transferring the layout to a physical template, a mask is generally created for each layer of the integrated circuit design.

The patterned photomask includes transparent and opaque areas for selectively exposing regions of the photoresist-coated wafer to an energy source. To fabricate a particular layer of the design, the corresponding mask is placed over the wafer and light is shone through the mask from the energy source. The end result is a semiconductor wafer coated with a photoresist layer having the desired pattern that defines the geometries, features, lines and shapes of that layer. The photolithography process is typically followed by an etch process during which the underlying substrate not covered or masked by the photoresist pattern is etched away, leaving the desired pattern in the substrate. This process is then repeated for each layer of the design.

Unfortunately, errors may occur during the manufacture of the masks that result in mask defects. A mask defect is any irregularity in the mask that deviates from the mask design. Using a mask having defects during the photolithography process may produce a circuit pattern on the substrate that fails to accurately represent the intended pattern and that may result in a non-functioning circuit, depending on the severity of the defect. A mask defect that will not result in any appreciable error in a circuit if the mask is used during fabrication is considered a "unprintable" defect, while a severe defect that may result in a fatal error in the circuit is deemed "printable", causing the mask to be discarded.

As semiconductor devices reach submicron feature sizes, the need to analyze the effects of mask defects has become increasingly important. As is well-known in the art, commercial process simulation software is available that makes it possible to predict the structure of a semiconductor device before actual silicon is available. Examples of process simulation software include TSUPREM-4™ and Taurus-LRC™ by Synopsys, Inc. of Mountain View, Calif. TSUPREM-4 is a 1D/2D process-simulation tool for optimizing IC fabrication processes, and Taurus-LRC is a "lithography rule checker" that verifies that a final mask layout delivers the intended result on silicon. Taurus-LRC also generates the expected silicon layout, which is compared to the intended chip layout. Differences larger than user-defined tolerances are reported as errors.

Process simulation software has also been used in automated inspection systems to detect photomask defects. An example of such a system is disclosed in US Patent Application Publication 2002/0019729 by Chang entitled "Visual Inspection And Verification System," published Feb. 14, 2002. In this system, an image of a defect portion of a mask and a set of lithography parameters are input to an image simulator. The image simulator generates a simulated image in response to the defect area image and the set of lithography parameters. The simulated image is a simulation of an image that would be printed on a wafer if the wafer were to be exposed to an illumination source directed through the portion of the mask. Chang also discloses generating a second simulated image that is a simulation of the wafer print of the portion of the design mask that corresponds to the portion represented by the defect area image. The first and second simulated images are then compared in order to determine the printability of any identified potential defects on the photolithography mask. A method of determining the process window effect of any identified potential defects is also provided for.

Although the defect detection systems described above are an improvement over visual inspection systems, current methods for detecting mask defects have disadvantages. One disadvantage is related to what is used as the input for the process simulation software. In Chang's system, for example, the mask is scanned with a high-resolution microscope or scanning electron microscope (SEM) and images of areas of the mask around identified potential defects are captured as an image. A digitizing device, such as a frame image grabber, is then used to digitize the data. The process simulation software accepts the digitized data and produces the simulation of a stepper image on a wafer for the physical mask. Chang, however, fails to describe how the features of the mask are extracted from the image. Furthermore, process simulation software typically requires the input data to be in GDSII format, and Chang fails to describe that the digitized data is converted to GDSII format. If the photograph of the mask is not accurately converted, then the input to the image simulation software will be inaccurate, and so will the resulting simulation.

Another problem with current defect detection systems is that although current detection systems can find mask defects, each defect is analyzed for its effect only on the horizontal processing layer on which the defect is located. For example, the conventional approach to analyzing a defect is to generate a simulated image from an image of a physical mask, and compare it with a second simulated image that was produced using the design data of the same mask as input (i.e., a mask that is free from defects). Any differences found are deemed defects and are evaluated for acceptance. Thus, the defects are evaluated to determine the impact the defect will have on the current layer in the circuit, which is known as testing for horizontal or spatial defects. However, as those with ordinary skill in the art will appreciate, mask defects may produce defects that affect adjacent layers in the circuit. Current defect detection systems fail to test for such "vertical effects."

Accordingly, what is needed is a defect detection system that accurately produces input for a simulation image from a photograph of a physical mask, and that analyzes the printability of the defects in the current horizontal layer as well as the vertically adjacent layers in the circuit design. The present invention addresses such a need.

SUMMARY OF THE INVENTION

The present invention provides a method and system for detecting defects in a physical mask used for fabricating a semiconductor device having multiple layers, where each layer has a corresponding mask. The method and system include receiving a digital image of the mask, and automatically detecting edges of the mask in the image using pattern recognition. The detected edges, which are stored in a standard format, are imported along with processing parameters into a process simulator that generates an estimated aerial image of the silicon layout that would be produced by a scanner using the mask and the parameters. The estimated aerial image is then compared to an intended aerial image of the same layer, and any differences found that are greater than predefined tolerances are determined to be horizontal defects. In addition, the effects that the horizontal defects may have on adjacent layers are analyzed to discover vertical defects.

According to the system and method disclosed herein, the present invention accurately produces input for the process simulator from the image of the physical mask, and analyzes the effects of the defects in the current horizontal layer as well as the vertically adjacent layers in the circuit design.

BRIEF DESCRIPTION OF THE DRAWINGS

FIGS. 2A and 2B are top and cross-sectional views, respectively of a portion of a sample mask showing two mask features.

FIG. 4 is a graph of example intensity values for a portion of the pixel 5 in a row of an SEM image.

FIG. 5 is a diagram illustrating example edge sets.

DETAILED DESCRIPTION

The present invention relates to mask defect detection techniques for semiconductor manufacturing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a mask defect detection and analysis system that accurately produces input for a process simulation application from a digital image of a physical mask. The detection system of the present invention also analyzes the printability of the defects in the horizontal layer as well as the vertical layers in the circuit design.

Figure 1:
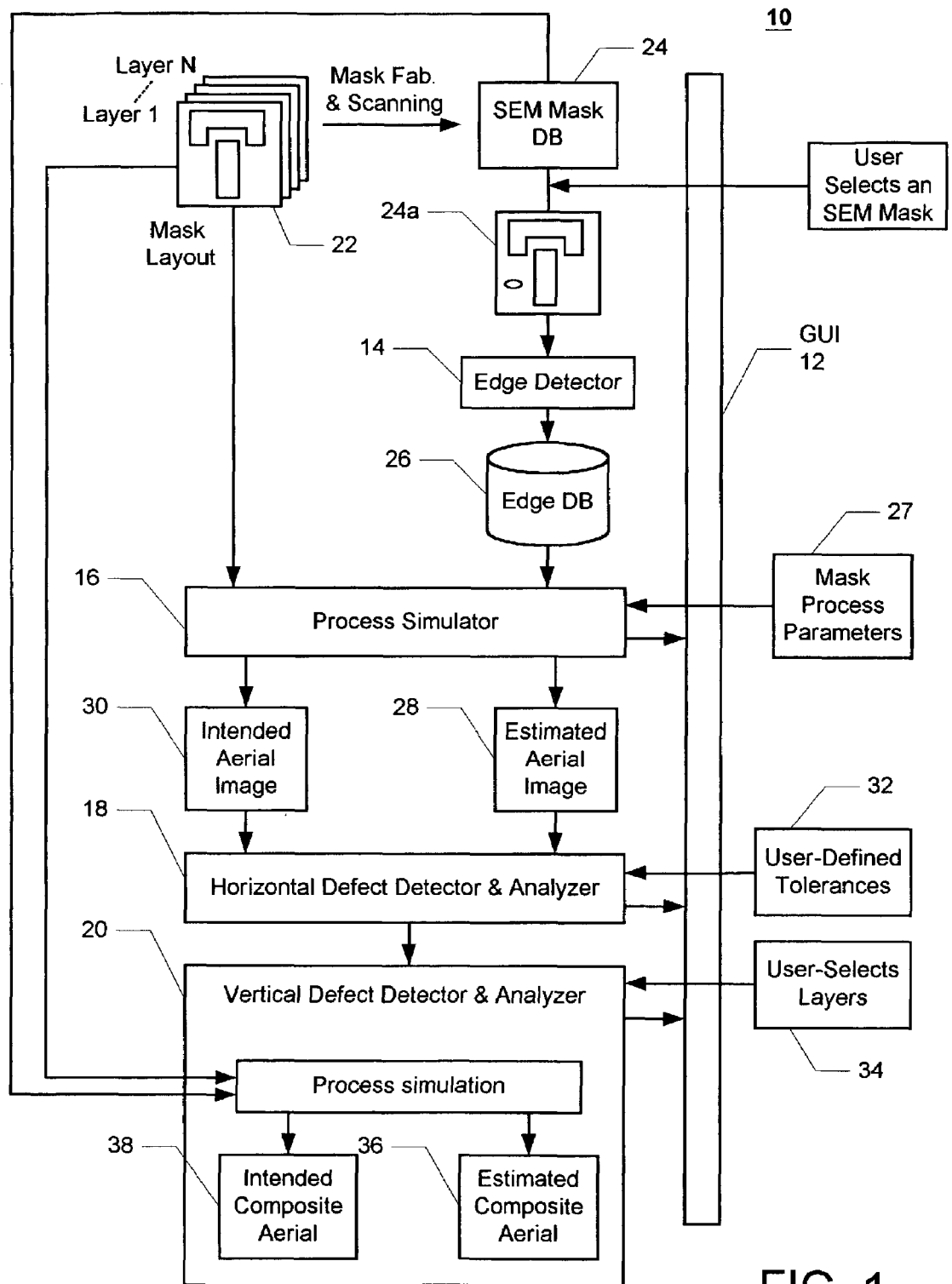
FIG. 1 is flow diagram of a mask defect detection and analysis system.

FIG. 1 is flow diagram of a mask defect detection and analysis system. The system 10 includes a graphical user interface (GUI) 12, an edge detector 14, a process simulator 16, a horizontal defect detector 18, and a vertical defect detector 20. In a preferred embodiment of the present invention, the defect detection and analysis system 10 is a software application that runs on server in a networked environment (not shown). However, the system may also be adapted to run on other computer systems, such a stand-alone computer PC or workstation.

The process begins with a mask layout database 22 representing the intended mask design, where the layout typically includes a separate mask for each processing layer in the design. From the mask layout database 22, the specified masks are fabricated and images of the masks are taken and stored as digital images in a directory or database. In a preferred embodiment, the physical masks are scanned by an electron microscope or other similar device to produce a set of digitized scanning electron microscope (SEM) images 24. Prior to actually using the physical masks to expose a silicon wafer, an operator uses the system 10 to determine the "printability" of the masks.

When the system 10 is invoked, the GUI 12 prompts the operator to select one of the SEM images 24 on which to perform defect detection and analysis. According to the present invention, rather than inputting the selected SEM image 24a directly into the process simulator 16, the SEM image 24a is first input to the edge detector 14. The edge detector 14 automatically detects mask edges within the SEM image 24a using pattern recognition. In a preferred embodiment, the edge detector 14 utilizes a snake algorithm of the present invention to find the mask edges, as explained below.

After the edges of the mask are detected in the SEM image 24a, the edges are stored in an edge database 26 in a standard format, such as GDSII. GDSII is a standard file format for transferring/archiving 2D graphical design data, and is required by the process simulator 16. GDSII contains a hierarchy of structures, each structure containing elements (e.g., boundary/polygon, path/polyline, text, box, structure references, and structure array references) that are situated on layers.

The process simulator 16 imports the edges defining the mask from the edge database 26 and processing parameters 27 supplied by the operator through the GUI 12, and generates an estimated aerial image 28 of the silicon layout that would be produced by a scanner using the mask and parameters 27. The process simulator 16 also imports the design data for the selected mask from the mask layout database 22 and generates an intended aerial image 30 of the silicon layout that would be produced by a scanner using the mask design. In a preferred embodiment, the estimated aerial image 28 and the intended aerial image 30 are stored in first and second databases, respectively, although they could be stored in the same database.

The estimated and intended aerial images 28 and 30 are then input to the horizontal defect detector 18. The horizontal defect detector 18 detects defects that could cause errors in the current processing layer by comparing the estimated aerial image 28 to the intended aerial image 30. Any differences that are greater than user-defined tolerances 32 are defined as horizontal defects. The tolerances preferably define the minimum sizes of defects and the minimum distances that the defects can be to features in the mask.

According to the present invention, if any horizontal defects are found, the vertical defect detector 20 is then used to analyze the effect that the defects on the current layer have on adjacent processing layers. The GUI 12 first prompts the operator to select which processing layers are to be analyzed, and receives the operator's selection of layers 34. In response, vertical defect detector 20 inputs the SEM images 24 corresponding to the selected layers to the process simulator 16 to generate corresponding estimated aerial images for the selected layers. The vertical defect detector 20 also inputs the design data for the selected layers from the mask layout 22 to the process simulator 16, which generates intended aerial images 30 for those layers.

The vertical defect detector 20 then overlays the estimated aerial image 28 for the current layer and the estimated aerial images 28 for the adjacent layers to create an estimated composite aerial image 36. The vertical defect detector 20 also overlays the intended aerial images and generates an intended composite aerial image 38. The vertical defect detector 20 then determines which defects could cause errors in the adjacent layers by comparing the estimated composite aerial image 36 with the intended composite aerial image 38. Any differences that are greater than the user defined tolerances 32 are defined as vertical defects. The operator may view the output of both the horizontal defect detector 18 and the vertical defect detector 20 to determine whether the automatically discovered defects are printable or unprintable.

As stated above, the edges of the masks are accurately found in the mask images 24 using a snake algorithm. Prior to explaining the snake algorithm used by the edge detector 14 for finding edges within the SEM images 24, a brief description of the input images 24 will be provided.

FIG. 2A is a top view of a portion of a sample mask showing two mask features 50A and 50B, and FIG. 2B is a cross-sectional view of one of the features 50. Sidewalls 52 defining the mask features 50 extend out of a substrate by a certain height. In addition, the sidewalls 52 are typically sloped inward from the bottom of the sidewall 52 to the top. The bottom of a sidewall 52 is called the outside edge, and the top of the sidewall 52 is the inside edge. SEM images 24 are gray scale images, where pixels defining most of the image have gray values (G), and pixels defining the sidewalls 52 have white values (W).

According to another aspect of the present invention, The snake algorithm follows edges of the mask through the digital image by iteratively analyzing intensity values of adjacent pixels and selecting the pixels having a highest partial derivative.

Figure 3A:
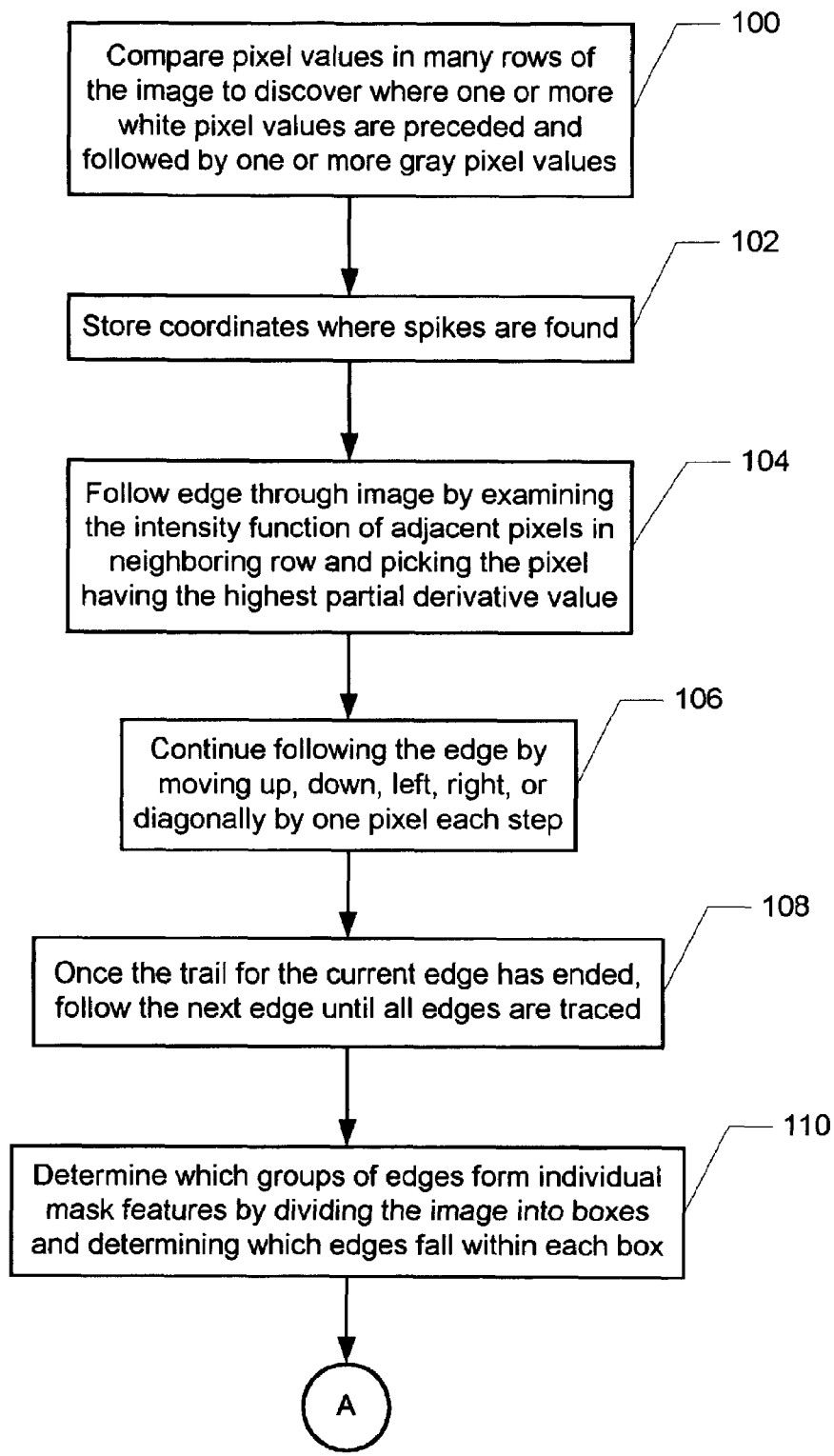
FIG. 3 is a flow chart illustrating the snake algorithm utilized by the edge detector.
Figure 3B:
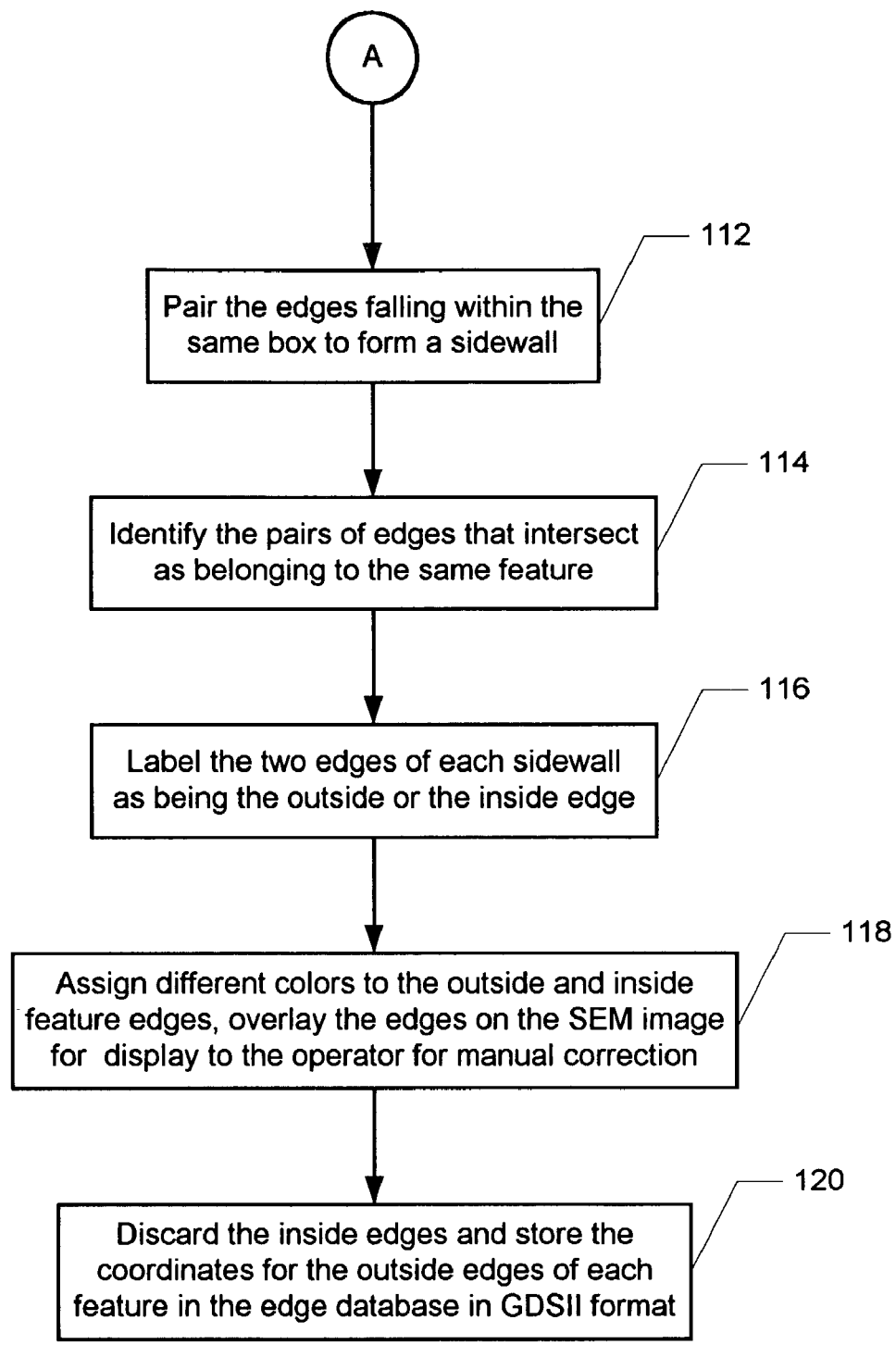

Referring now to FIG. 3, a flow chart illustrating the snake algorithm utilized by the edge detector 14 is shown. The snake algorithm begins finding edges by locating gray/white transitions in the image 24. This is accomplished in step 100 by comparing the pixel values in many rows of the image to discover where one or more white pixel values are preceded and followed by one or more gray pixel values. These transition locations are referred to as "spikes". In step 102, the coordinates of each spike are stored as they are discovered.

After the image 24 has been scanned for spikes, the algorithm searches the rows adjacent to each spike in an attempt to follow the edges. The algorithm tries to identify the most likely pixel laying in the same general direction as the edge being followed. Following an edge across the image is accomplished in step 104 by examining the intensity function of several adjacent pixels in the neighboring row and picking the pixel having the highest partial derivative value in the direction perpendicular to the edge.

FIG. 4 is a graph of example intensity values for a portion of the pixels in a row of the image, where the highest intensity indicates white and the lowest indicates black. In a preferred embodiment, the partial derivative is found by finding the gradient of the intensity function in the immediate neighborhood of a pixel and multiplying the gradient's magnitude by the sine of the angle between the gradient vector and the direction of the edge.

Referring again to FIG. 3, the algorithm continues following the edge in step 106 by moving up, down, left, right, or diagonally by one pixel each step. There is a limitation on how tight the algorithm can follow a corner of an edge, but the limitation does not significantly effect edge detection because the corners of features of a real mask image are not sharp. The result of following pixels having the highest partial derivative is that both the outside and inside edges of feature sidewalls 52 will be found. Once the trail for an edge has ended, the algorithm follows the next edge in the same manner until all edges are traced in step 108.

Referring again to FIG. 3, after all the edges are found, in step 110, it is determined which groups of edges form individual mask features by dividing the image 24 into boxes and determining which edges fall within each box. In step 112, the edges falling within the same box are paired to form a sidewall. In step 114, the pairs of edges that intersect are identified as belonging to the same feature.

In step 116, the two edges of each sidewall are labeled as being the outside or inside edge by calculating the length of all edges on each side and determining that the edge set with the longest length is the outside edge set and the other is the inside edge set. In a preferred embodiment, the length is determined from the total coordinate (x, y) span of the edge set. FIG. 5 is a diagram illustrating example edge sets. Two pairs of edges intersect if they have an edge in common. Pairs 1 and 2 intersect because they share edge B. Hence, they belong to the same feature. Thus, edges A and C are recognized as an edge set for one side of a single feature.

In step 118, the outside edges of the features are assigned one color, while the inside edges are assigned another color, and both are overlaid over the SEM image 24 and displayed to the operator for manual correction. If, for example, a set of edges is identified as inside when it's really outside, the operator may override the decision. In step 120, when the operator is done, the inside edges are discarded and the coordinates for the outside edges of each feature are stored in the edge database 26 in GDSII format.

A method and system for performing mask defect analysis has been disclosed. The present invention has been described in accordance with the embodiments shown, and one of ordinary skill in the art will readily recognize that there could be variations to the embodiments, and any variations would be within the spirit and scope of the present invention. In addition, software written according to the present invention may be stored on a computer-readable medium, such as a removable memory, or transmitted over a network, and loaded into a computer for execution. Accordingly, many modifications may be made by one of ordinary skill in the art without departing from the spirit and scope of the appended claims.

What is claimed is:

1. A method for detecting defects in a physical mask used for fabricating a semiconductor device having multiple layers, where each layer has a corresponding mask, the method comprising:
   (a) receiving a digital image of the mask;
   (b) automatically detecting edges of the mask in the image using pattern recognition;
   (c) storing the detected edges in a standard format;
   (d) importing the detected edges and processing parameters into a process simulator for generating an estimated aerial image of the silicon layout that would be produced by a scanner using the mask;
   (e) comparing the estimated aerial image to an intended aerial image of the same layer, and determining that any differences found that are greater than predefined tolerances are horizontal defects; and
   (f) analyzing effects that the horizontal defects have on adjacent layers to discover vertical defects.

2. The method of claim 1 further including displaying the detected defects to an operator and allowing the operator to determine whether the defects are printable or unprintable.

3. A method for detecting defects in a physical mask used for fabricating a semiconductor device having multiple layers, where each layer has a corresponding mask, the method comprising the steps of:
   (a) receiving a digital image of the mask;

(b) automatically detecting edges of the mask in the image using pattern recognition;
(c) storing the detected edges in a standard format;
(d) importing the detected edges and processing parameters into a process simulator for generating an estimated aerial image of the silicon layout that would be produced by a scanner using the mask;
(e) comparing the estimated aerial image to an intended aerial image of the same layer, and determining that any differences found that are greater than predefined tolerances are horizontal detects;
(f) analyzing effects that the horizontal defects have on adjacent layers to discover vertical defects, wherein the analyzing comprises:
  (i) prompting an operator to select which processing layers are to be analyzed for vertical defects;
  (ii) generating respective estimated aerial images from digital images corresponding to the selected layers;
  (iii) generating intended aerial images for the selected layers;
  (iv) overlaying the estimated aerial image for the current layer and the estimated aerial images for the selected layers to create an estimated composite aerial image;
  (v) overlaying the intended aerial image for the current layer and the intended aerial images for the selected layers to generate an intended composite aerial image;
  (vi) comparing the estimated composite aerial image with the intended composite aerial image; and
  (vii) determining that any differences found that are greater than the predefined tolerances are vertical defects; and
(g) displaying the detected defects to the operator and allowing the operator to determine whether the defects are printable or unprintable.

4. The method of claim 1 wherein the intended aerial image is generated by importing design data for the selected mask from a mask layout database into the process simulator and generating the aerial image of the silicon layout that would be produced using the design of the mask.

5. The method of claim 4 wherein the estimated aerial image and the intended aerial image are stored in first and second databases, respectively.

6. The method of claim 5 wherein the predefined tolerances are received from the operator and define minimum sizes of defects and minimum distances that the defects can be to features in the mask.

7. The method of claim 6 wherein the standard format comprises GDSII.

8. The method of claim 1 wherein the step of detecting edges of the mask includes a snake algorithm that follows the edges of the mask through the digital image by iteratively analyzing intensity values of adjacent pixels and selecting the pixels having a highest partial derivative.

9. A mask defect detection system, comprising:
an edge detector for automatically detecting mask edges within a digital image of a physical mask using pattern recognition, the physical mask corresponding to a processing layer in a multi-processing layer design;
a process simulator for inputting the detected edges and generating an estimated aerial image of the silicon layout that would be produced by a scanner using the physical mask;
a horizontal defect detector for detecting defects that could cause errors in a current processing layer by comparing the estimated aerial image to an intended aerial image, and defining any differences that are greater than user-defined tolerances as horizontal defects; and
a vertical defect detector for analyzing effects that the horizontal defects have on adjacent layers to discover vertical defects.

10. The defect detection system of claim 9 wherein the edge detector comprises a snake algorithm that follows the edges of the mask through the digital image by iteratively analyzing intensity values of adjacent pixels and selecting the pixels having a highest partial derivative.

11. The defect detection system of claim 10 wherein the defects are displayed to an operator for the operator to determine whether the defects are printable or unprintable.

12. A mask defect detection system, comprising:
an edge detector for automatically detecting mask edges within a digital image of a physical mask using pattern recognition, the physical mask corresponding to a processing layer in a multi-processing layer design;
a process simulator for inputting the detected edges and generating an estimated aerial image of the silicon layout that would be produced by a scanner using the physical mask;
a horizontal defect detector for detecting defects that could cause errors in a current processing layer by comparing the estimated aerial image to an intended aerial image, and defining any differences that are greater than user-defined tolerances as horizontal defects; and
a vertical defect detector for analyzing effects that the horizontal defects have on adjacent layers to discover vertical defects,
wherein the vertical defect detector is functional to:
prompt an operator to select which processing layers are to be analyzed for vertical defects;
request the process simulator to generate respective estimated aerial images from digital images corresponding to the selected layers;
request the process simulator to generate intended aerial images for the selected layers;
overlay the estimated aerial image for the current layer and the estimated aerial images for the selected layers to create an estimated composite aerial image;
overlay the intended aerial image for the current layer and the intended aerial images for the selected layers to generate an intended composite aerial image;
compare the estimated composite aerial image with the intended composite aerial image; and
define any differences that are greater than the user-defined tolerances as vertical defects.

13. The defect detection system of claim 9 wherein the intended aerial image is generated by importing design data for the selected mask from a mask layout database into the process simulator and generating the aerial image of the silicon layout that would be produced using the design of the mask.

14. The defect detection system of claim 13 wherein the estimated aerial image and the intended aerial image are stored in first and second databases, respectively.

15. The defect detection system of claim 14 wherein the predefined tolerances are received from the operator and define minimize sizes of defects and minimum distances that the defects can be to features in the mask.

16. The defect detection system of claim 15 wherein the standard format comprises GDSII.

17. The defect detection system of claim 16 wherein the system comprises is a software application that runs on server in a networked environment.

18. The defect detection system of claim 17 further including a graphical user interface (GUI) for allowing the operator select the digital image from a selection of digital images, input process parameters for the process simulator, and to input tolerances for defect analysis.

19. A computer-readable medium containing program instructions for detecting defects in a physical mask used for fabricating a semiconductor device having multiple layers, where each layer has a corresponding mask, the program instructions for:
(a) receiving a digital image of the mask;
(b) automatically detecting edges of the mask in the image using pattern recognition;
(c) storing the detected edges in a standard format;
(d) importing the detected edges and processing parameters into a process simulator for generating an estimated aerial image of the silicon layout that would be produced by a scanner using the mask;
(e) comparing the estimated aerial image to an intended aerial image of the same layer, and determining that any differences found that are greater than predefined tolerances are horizontal defects; and
(f) analyzing effects that the horizontal defects have on adjacent layers to discover vertical defects.

20. The computer-readable medium of claim 19 further including the instruction of displaying the detected defects to an operator and allowing the operator to determine whether the defects are printable or unprintable.

21. A computer-readable medium containing program instructions for detecting defects in a physical mask used for fabricating a semiconductor device having multiple layers, where each layer has a corresponding mask, the program instructions for:
(a) receiving a digital image of the mask;
(b) automatically detecting edges of the mask in the image using pattern recognition;
(c) storing the detected edges in a standard format;
(d) importing the detected edges and processing parameters into a process simulator for generating an estimated aerial image of the silicon layout that would be produced by a scanner using the mask;
(e) comparing the estimated aerial image to an intended aerial image of the same layer, and determining that any differences found that are greater than predefined tolerances are horizontal defects;
(f) analyzing effects that the horizontal defects have on adjacent layers to discover vertical defects, wherein the analyzing includes the instructions of:
  (i) prompting an operator to select which processing layers are to be analyzed for vertical defects;
  (ii) generating respective estimated aerial images from digital images corresponding to the selected layers;
  (iii) generating intended aerial images for the selected layers;
  (iv) overlaying the estimated aerial image for the current layer and the estimated aerial images for the selected layers to create an estimated composite aerial image;
  (v) overlaying the intended aerial image for the current layer and the intended aerial images for the selected layers to generate an intended composite aerial image;
  (vi) comparing the estimated composite aerial image with the intended composite aerial image; and
  (vii) determining that any differences found that are greater than the predefined tolerances are vertical defects; and
(g) displaying the detected defects to the operator and allowing the operator to determine whether the defects are printable or unprintable.

22. The computer-readable medium of claim 19 wherein the intended aerial image is generated by importing design data for the selected mask from a mask layout database into the process simulator and generating the aerial image of the silicon layout that would be produced using the design of the mask.

23. The computer-readable medium of claim 22 wherein the estimated aerial image and the intended aerial image are stored in first and second databases, respectively.

24. The computer-readable medium of claim 23 wherein the predefined tolerances are received from the operator and define minimize sizes of defects and minimum distances that the defects can be to features in the mask.

25. The computer-readable medium of claim 24 wherein the standard format comprises GDSII.

26. The computer-readable medium of claim 19 wherein the instruction of detecting edges of the mask includes a snake algorithm that follows the edges of the mask through the digital image by iteratively analyzing intensity values of adjacent pixels and selecting the pixels having a highest partial derivative.

* * * * *